US012663465B2

(12) United States Patent
Case et al.

(10) Patent No.: US 12,663,465 B2
(45) Date of Patent: Jun. 23, 2026

(54) TEST AND MEASUREMENT INSTRUMENT ACCESSORY WITH RECONFIGURABLE PROCESSING COMPONENT

(71) Applicant: Tektronix, Inc., Beaverton, OR (US)

(72) Inventors: Charles W. Case, Lake Oswego, OR (US); Daniel G. Knierim, Beaverton, OR (US); Joshua J. O'Brien, Aloha, OR (US); Josiah A. Bartlett, Forest Grove, OR (US); Julie A. Campbell, Beaverton, OR (US)

(73) Assignee: Tektronix, Inc., Beaverton, OR (US)

( * ) Notice: Subject to any disclaimer, the term of this patent is extended or adjusted under 35 U.S.C. 154(b) by 104 days.

(21) Appl. No.: 18/387,810

(22) Filed: Nov. 7, 2023

(65) Prior Publication Data

US 2024/0069094 A1 Feb. 29, 2024

Related U.S. Application Data

(63) Continuation of application No. 17/379,940, filed on Jul. 19, 2021, now Pat. No. 11,815,548.

(60) Provisional application No. 63/054,186, filed on Jul. 20, 2020.

(51) Int. Cl.
*G01R 31/28* (2006.01)
*G01R 29/26* (2006.01)

(52) U.S. Cl.
CPC ......... *G01R 31/2886* (2013.01); *G01R 29/26* (2013.01)

(58) Field of Classification Search
CPC .............. G01R 31/2886; G01R 29/26; G01R 31/31932; G01R 31/31908
See application file for complete search history.

(56) References Cited

U.S. PATENT DOCUMENTS

| | | | |
|---|---|---|---|
| 5,025,205 A | 6/1991 | Mydill et al. |
| 5,952,834 A | 9/1999 | Buckley |
| 6,057,690 A | 5/2000 | Buckley |
| (Continued) | | | |

FOREIGN PATENT DOCUMENTS

| | | |
|---|---|---|
| CN | 100362352 C | 1/2008 |
| CN | 202141750 U | 2/2012 |
| (Continued) | | |

OTHER PUBLICATIONS

CN 205280789 U English Translation (Year: 2016).

(Continued)

*Primary Examiner* — Akm Zakaria
(74) *Attorney, Agent, or Firm* — Miller Nash LLP; Andrew J. Harrington

(57) ABSTRACT

A test system includes a test and measurement device having an input port for receiving signals for testing or measuring, a reprogrammable test accessory having an output coupled to the input port of the test and measurement device. The reprogrammable test accessory includes a test port structured to accept one or more test signals from a Device Under Test (DUT), a processor, a reprogrammable data protocol analyzer for determining whether data carried by the one or more test signals from the DUT conform to a predetermined data protocol, and a reprogramming facility for modifying the reprogrammable data protocol analyzer from a first configuration to a second configuration. Methods of operation are also described.

18 Claims, 6 Drawing Sheets

(56) References Cited

U.S. PATENT DOCUMENTS

| | | | |
|---|---|---|---|
| 6,311,149 B1 | 10/2001 | Ryan et al. | |
| 6,442,725 B1 | 8/2002 | Schipke et al. | |
| 6,480,006 B1 | 11/2002 | Buckley | |
| 6,937,006 B2 | 8/2005 | West | |
| 6,940,271 B2 | 9/2005 | West | |
| 7,152,027 B2 | 12/2006 | Andrade et al. | |
| 7,590,903 B2 | 9/2009 | Volkerink et al. | |
| 8,838,406 B2 | 9/2014 | Rivoir | |
| 10,241,146 B2 | 3/2019 | Su et al. | |
| 10,652,131 B2 | 5/2020 | Jones et al. | |
| 10,673,723 B2 | 6/2020 | Ungar et al. | |
| 10,677,845 B2 | 6/2020 | Detofsky et al. | |
| 11,502,759 B2 | 11/2022 | Schaefer et al. | |
| 2002/0055834 A1 | 5/2002 | Andrade et al. | |
| 2007/0266288 A1 | 11/2007 | Volkerink et al. | |
| 2008/0157805 A1 | 7/2008 | Kushnick et al. | |
| 2010/0218044 A1* | 8/2010 | Roblett | H04L 43/50 |
| | | | 714/E11.144 |
| 2011/0109320 A1 | 5/2011 | Curt et al. | |
| 2012/0242357 A1 | 9/2012 | Eccles | |
| 2013/0227367 A1* | 8/2013 | Czamara | G01R 31/2834 |
| | | | 714/735 |
| 2014/0122009 A1 | 5/2014 | Meiyappan | |
| 2015/0054532 A1 | 2/2015 | Yoo et al. | |
| 2016/0036684 A1 | 2/2016 | Jones et al. | |
| 2017/0059618 A1 | 3/2017 | Lee et al. | |
| 2017/0269147 A1* | 9/2017 | Rezgui | G01R 15/00 |
| 2018/0205621 A1 | 7/2018 | Ungar et al. | |
| 2018/0252772 A1 | 9/2018 | Detofsky et al. | |
| 2018/0313889 A1 | 11/2018 | Su et al. | |
| 2019/0128964 A1 | 5/2019 | Narayanun et al. | |
| 2019/0353696 A1* | 11/2019 | Hsu | G01R 31/2834 |
| 2020/0249275 A1 | 8/2020 | Froelich et al. | |
| 2020/0250368 A1 | 8/2020 | Froelich et al. | |
| 2020/0259730 A1 | 8/2020 | Ungar et al. | |
| 2021/0341517 A1 | 11/2021 | Sterzbach | |
| 2021/0405108 A1 | 12/2021 | Strickling et al. | |
| 2022/0018896 A1 | 1/2022 | Case et al. | |
| 2022/0163587 A1 | 5/2022 | Froelich et al. | |
| 2022/0163588 A1 | 5/2022 | Froelich et al. | |
| 2022/0200706 A1 | 6/2022 | Schaefer et al. | |
| 2023/0047859 A1 | 2/2023 | Feshwaroju et al. | |
| 2024/0069094 A1 | 2/2024 | Case et al. | |

FOREIGN PATENT DOCUMENTS

| | | | |
|---|---|---|---|
| CN | 203572858 U | 4/2014 | |
| CN | 205280789 U | 6/2016 | |
| CN | 105866501 A | 8/2016 | |
| CN | 205506896 U | 8/2016 | |
| CN | 205749622 U | 11/2016 | |
| CN | 107561331 A | 1/2018 | |
| CN | 207380111 U | 5/2018 | |
| CN | 108802459 A | 11/2018 | |
| CN | 210465520 U | 5/2020 | |
| CN | 210534212 U | 5/2020 | |
| CN | 115389002 A | 11/2022 | |
| CN | 115525495 A | 12/2022 | |
| EP | 2135096 A1 | 12/2009 | |
| JP | 2000241460 | 9/2000 | |
| TW | 201842447 | 12/2018 | |
| TW | 202007997 | 2/2020 | |
| WO | 2010054669 A1 | 5/2010 | |
| WO | 2022020275 A1 | 1/2022 | |
| WO | 2022115495 A1 | 6/2022 | |

OTHER PUBLICATIONS

Davis, Sam. First 1 00MS/s Open Source Oscilloscopefor iPad, Android and PC. Electronic Design. https://www.electronicdesign.com/print/content/21196736. Feb. 11, 2014 (Year: 2014).

Korean Intellectual Property Office, International Search Report and Written Opinion for International Application PCT/US2021/042259, Nov. 11, 2021, 9 pages, Daejeon, Republic of Korea.

Weston, Dane. Getting the Scoop on Labnation's Smartscope. Nuts and Volts Magazine. May 2017 (Year: 2017).

Atsuchi Ogawa, "Oscilloscope/Signal Generator/Spectrum Analyzer in your pocket, All-in-one Audio Analyzer, e-scope3-in-1", Magazine titled "Transistor Technologies", Jun. 11, 2015, p. 42, vol. 52, No. 7, CQ Publishing Co., Ltd., Japan.

* cited by examiner

TEST AND MEASUREMENT INSTRUMENT ACCESSORY WITH RECONFIGURABLE PROCESSING COMPONENT

CROSS-REFERENCE TO RELATED APPLICATIONS

This disclosure is a continuation of U.S. Non-provisional patent application Ser. No. 17/379,940, titled "TEST AND MEASUREMENT INSTRUMENT ACCESSORY WITH RECONFIGURABLE PROCESSING COMPONENT," filed on Jul. 19, 2021, which claims benefit of U.S. Provisional Application No. 63/054,186, titled "TEST AND MEASUREMENT INSTRUMENT ACCESSORY WITH RECONFIGURABLE PROCESSING COMPONENT," filed on Jul. 20, 2020, the disclosures of both of which are incorporated herein by reference in their entirety.

TECHNICAL FIELD

This disclosure relates to test and measurement systems, such as oscilloscopes and other measuring devices, and more particularly to a test and measurement probe or accessory included as part of the system and having a reconfigurable processing component.

BACKGROUND

A measurement or test probe provides a physical and electrical connection between a test point on a device being measured and a measuring device, such as an oscilloscope. The device being measured, referred to as a device under test (DUT), may have specialized connection points to which the measurement probe may attach, or a sensing tip of a probe may be used to physically contact various places on the DUT for measurement. Measurement probes differ in complexity, with the simplest probes being little more than wires connecting the DUT to a sensing input on the oscilloscope, while more complex probes may include active circuitry to modify the signal from the DUT before passing a testing signal to the oscilloscope. A differential oscilloscope probe, for example, includes a differential amplifier to subtract two differential signals and provide a single signal to the oscilloscope that represents the differential measurement.

Modern probes are generally selected based on the desired parameters of the DUT to be tested, such as current and voltage. As mentioned above, differential probes may be used to convert differential signals to a single signal representing the differences in the signals being measured. Some probes isolate the DUT from the oscilloscope, and may be useful in significantly reducing common mode interference. Other probes include logic analyzer probes that acquire digital signals from a DUT for analysis by the oscilloscope.

Although oscilloscope probes provide useful function for testing various DUTs, increasing probe performance and abilities is a continuous goal.

DESCRIPTION

Embodiments of the disclosure generally include a reprogrammable or reconfigurable test and measurement instrument accessory, such as a measurement probe, that may be updated by the user.

Figure 1:
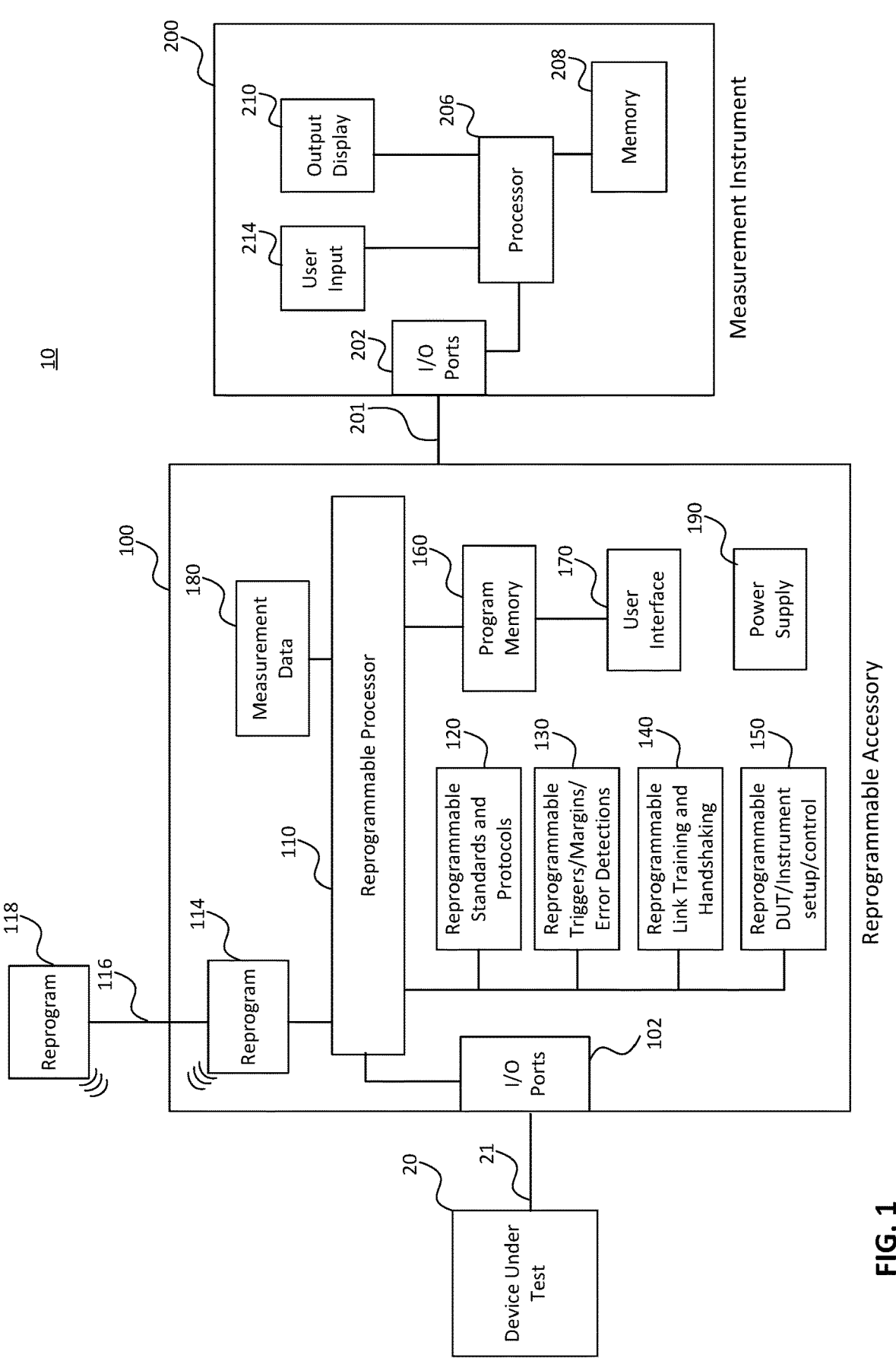
FIG. 1 is an example functional block diagram illustrating a test system including a reprogrammable test and measurement accessory according to embodiments of the invention.

FIG. 1 is an example functional block diagram illustrating a test system 10 including a reprogrammable test and measurement accessory 100 according to embodiments of the invention. Various functions represented in the functional block diagrams, such as FIGS. 1-3 may refer to separate hardware that performs specific functions, or may be implemented in practice as various functions that are possible on a suitably programmed device, as described in detail below. The accessory 100 couples a Device Under Test (DUT) 20 to a test and measurement instrument 200 to primarily pass information about the DUT 20 to the oscilloscope, although the accessory 100 may also measure and/or characterize signals occurring in the DUT, and pass such information to the instrument as well. The DUT 20 may be any type of device generating electrical or optical signals that the user desires to analyze. The DUT 20 may generate analog or digital signals, or a combination of these signals, and send them over a communication channel 21 to the accessory 100. The communication channel 21 may be wired or wireless. The communication channel 21 may include a single or multiple communication paths received by the accessory 100. The communication channel 21 may operate at a given frequency so that data is received by the accessory 100 on the same channel over time. As described below, the user may test a single signal output from the DUT at a time, or may test multiple signals at the same time, such as on a bus or a poly-phase signal. Details of signals to be tested are provided below.

The signals from the DUT are received by the reprogrammable test and measurement accessory 100, also referred to as a probe, or just an accessory 100. In general, the accessory 100 receives the signals from the DUT 20, and passes signals to the test and measurement instrument 200. The accessory 100 may inspect the signal from the DUT 20, and may characterize the signal before passing it to the instrument 200. In some embodiments the accessory 100 can perform analysis on the signal from the DUT 20, and pass the original signal from the DUT to the instrument 200 without modification. In this way the accessory 100 can perform analysis on the signal from the DUT 20 that is separate from the instrument 200. In other embodiments the accessory 100 passes both its characterization and the original signal to the instrument 200. Many various options are described in detail below.

The test and measurement instrument 200 couples to the accessory 100 through a communication channel 201 to one or more ports 202. The ports 202 may be any electrical signaling medium, and may further include receivers, transmitters, and/or transceivers. The signals to be measured or analyzed by the instrument 200 may originate from the DUT 20 or from the accessory 100. As described above, in some embodiments, the instrument 200 receives an original signal from the DUT 20 that the accessory 100 has passed through, along with a characterization or information about the signal. As with the communication channel 21, the communication channel 201 may include a single or multiple communication paths received by the instrument 200. The instrument 200 may sample information on the communication channel 201 at a given frequency so that time-based data is received by the instrument 200 on the same channel over time.

Although only one processor 206 is shown in FIG. 1 for ease of illustration, as will be understood by one skilled in the art, multiple processors 206 of varying types may be used in combination, rather than a single processor 206. The one or more processors 206 may be configured to execute instructions from memory 208 and may perform any analysis on the received signals. Memory 208 may be implemented as processor cache, random access memory (RAM), read only memory (ROM), solid state memory, hard disk drive(s), or any other memory type. Memory 208 acts as a medium for storing data, computer program products, and other instructions. The test and measurement instrument 200 may include additional hardware and/or processors depending on the particular accessory 100 or DUT 20 to which it is connected.

User inputs 214 are coupled to the one or more processors 206. User inputs 214 may include menu buttons, a keyboard, mouse, touchscreen, programmable interface, and/or any other controls employable by a user to interact with the instrument 200. The user inputs 214 may be used to select particular tests or analysis for the signals from the accessory 100, as well as for providing selected parameters to be used by the instrument 200.

The display 210 may be a digital screen, a cathode ray tube based display, or any other monitor to display waveforms, measurements, and other data to a user. While the components of test and measurement instrument 200 are depicted as being integrated within test and measurement instrument 200, it will be appreciated by a person of ordinary skill in the art that any of these components can be external to test instrument 200 and can be coupled to test instrument 200 in any conventional manner (e.g., wired and/or wireless communication media and/or mechanisms). For example, in some configurations, the display 210 may be remote from the test and measurement instrument 200, and the instrument may send signals over a communication network (not illustrated) to the separate output display. In some embodiments the user may connect to the instrument 200 over a network, such as the internet. In such embodiments, the keyboard and mouse of the user's computer may be used as the user input 214, and the display of the user's computer may be used as the output display.

Although the instrument 200 is referred to herein as an oscilloscope for convenience, the instrument may be any test and measurement device, such as an oscilloscope, logic analyzer, power analyzer, spectrum analyzer, or vector network analyzer, or other testing and/or measuring device.

Figure 2:
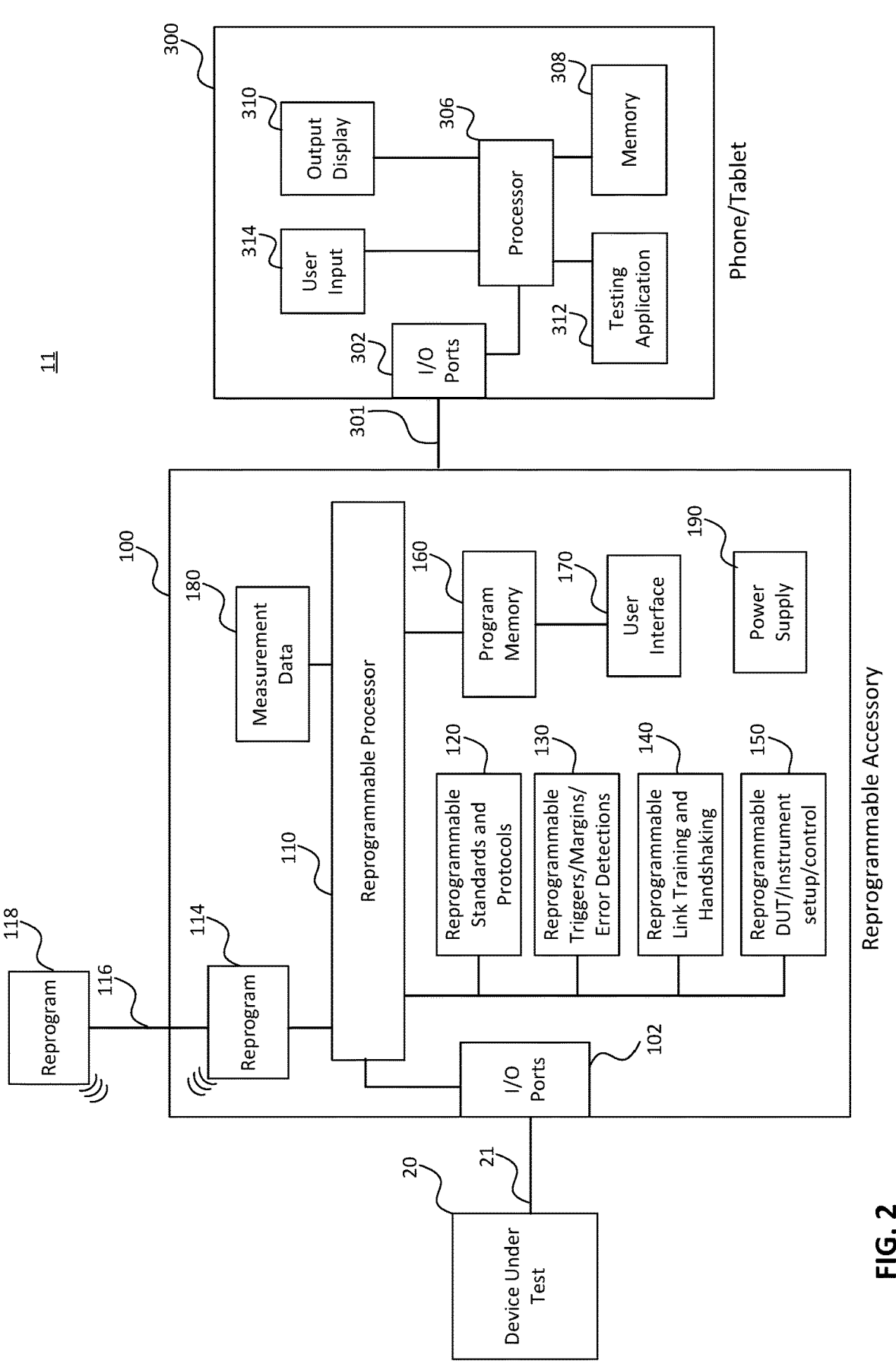
FIG. 2 is an example functional block diagram illustrating a test system including a reprogrammable test and measurement accessory coupled to a tablet, computer or mobile phone, according to embodiments of the invention.

In other embodiments, the accessory 100 may be used in conjunction with a personal computer, cell phone or tablet 300, such as the measurement system 11 illustrated in FIG. 2. In FIG. 2 the DUT 20 and accessory 100 are identical to that of FIG. 1, except that the accessory 100 is coupled to a device not typically associated with measuring signals, such as a computer, phone or tablet 300. Although embodiments of the invention may work with other portable computing devices, FIG. 2 is described with reference to a computing tablet 300. The tablet 300 includes many of the same functions of a measurement instrument 200, except the tablet is not normally configured to measure signals. The tablet 300 includes a processor 306 and memory 308. Its user input 314 and output display 310 are typically combined as a touchscreen, as is well known.

A testing application 312 may be loaded onto the tablet 300 using standard application loading techniques, such as through the App Store of Apple, Inc., or through Google Play on an ANDROID device. The testing application 312 may be selected by the user just as the user would open e-email or a weather application. The testing application 312 is programmed to cause the processor 306 to perform certain functions based on signals received from the accessory 100. The testing application 312 may be programmed with oscilloscope-like features, such as triggers, margin detectors, procedures to identify and analyze data according to various protocols and standards, etc. The accessory 100 could include functions and hardware that may not be resident or possible on the traditional hardware in the connected device 300. A measurement system such as system 11 of FIG. 2 would allow a user to upgrade their tablet 300, for example, to have the ability to capture signals from a DUT and trigger on a preconfigured criterion. In effect, a system such as system 11 could allow a user to perform sophisticated measurements on a device that already includes a display, computer processor, and input/output.

The accessory 100 could connect to the tablet 300 through a communication channel 301, which is a built-in or typical communication channel for tablets. Communication channels 301 could include using a USB cable, Lightning interface, phone port, or one of the wireless communication channels such as WiFi or BLUETOOTH. Then, in operation, the testing application 312 running on the tablet 300 could accept signals of the DUT from the accessory 100 and generate output displays, measured data, charts, graphs, etc. that would allow the user to visualize, store, or otherwise use information from the DUT 20.

In some embodiments the accessory 100 may capture signals from the DUT 20 at high speeds, store them in memory, then offload the data to the tablet 300. In other embodiments, the accessory 100 captures data from the DUT 20, then uses the tablet 300 to store captured data into the cloud or on another network for further processing.

Referring back to FIG. 1, differently than previous probes or accessories, the accessory 100 is a reprogrammable or reconfigurable device. Specifically, the accessory 100 includes a processor 110, which may be a microcontroller, a Field Programmable Gate Array (FPGA), or a system-on-chip (SoC), among other possibilities. The processor 110 is referred to herein as the processor 110, no matter what physical form it or the processing function is actually implemented in.

The processor 110 includes a reprogramming function 114, which receives instructions for reprogramming over an updating channel 116 from a reprogramming facility or reprogrammer 118. The updating channel 116 may be wired or wireless. In other words, to reprogram the reprogrammable processor 110, the user may connect it to the reprogrammer 118 through a wireless connection, such as Wifi or BLUETOOTH, or the user could plug in the accessory 100 to a reprogramming device 118. The reprogramming device 118 may be a host instrument, such as the instrument 200, or may be another device. In some embodiments the reprogramming device 118 may be a computer. In some embodiments the reprogramming could occur over the communication channels 21 or 201 rather than having a separate and dedicated channel 116 in the accessory 100 for updating the reprogrammable processor 110.

As mentioned above, the various functions illustrated in functional block diagrams refer to functions performed by the various devices, rather than illustrating devices themselves. For example, the reprogrammer 114 of FIGS. 1 and 2 may be implemented by functions, procedures, operations, or programs that are executed by the reprogrammable processor 110. Updating the reprogrammable processor 110 may include updating the processor 110, such as an FPGA, to a completely new design or program, or modifying only a portion of an existing design or program. In some embodiments the processor 110 may perform a self-check at power on and will update automatically if a newer version of the processor 110 exists and is available. In other embodiments the user controls when and whether to update the processor 110. The accessory 100 is a powered device and includes or is coupled to a power supply 190.

The accessory 100 may optionally include a user interface 170, which allows a user to operate the reprogrammable accessory 100. The user interface may be a simple set of one or more buttons and an output LED to confirm status, or the user interface 170 could be menu driven. In some embodiments the user interface 170 may operate on another device, and is used to send configuration commands or mode commands to the reprogrammable accessory 100. The user interface 170 may also be used by the user to reprogram all or part of the reprogrammable accessory 100.

In addition or as a part of the processor 110 being programmable, the accessory 100 also includes data-oriented functions that may also be programmable or updatable. For example, a reprogrammable function 120 includes various standards, protocols, and functions that may be reprogrammable or able to be updated as the various standards are updated. Other functions or parameters that operate on data from the DUT 20 may be stored and updated in a reprogrammable trigger 130. Although it is referred to as only a reprogrammable trigger 130, this reprogrammable function also includes other error detectors, error insertion, and margin detectors. Specific examples and implementation details are provided below. Yet additional reprogrammable and updatable functions include link training and handshake functions 140. Further, another set of functions 150 that may be reprogrammable and updatable include functions that can set up the instrument 200 or the DUT 20. In some embodiments this device control may be dependent on certain data that is received from the DUT 20. As described above, any or all of the functions within the accessory 100 may, in fact, be implemented by the reprogrammable processor 110. In another embodiments, the functions within the accessory 100 may be separate hardware, software, or firmware processes that operate in conjunction with the reprogrammable processor 110. These functions may be updated when the reprogrammable processor 110 is updated, or these functions may be updated individually and separate from updates to the reprogrammable processor 110.

Details of these various programmable functions and features in a test and measurement accessory, such as the accessory 100, are provided below.

Figure 3:
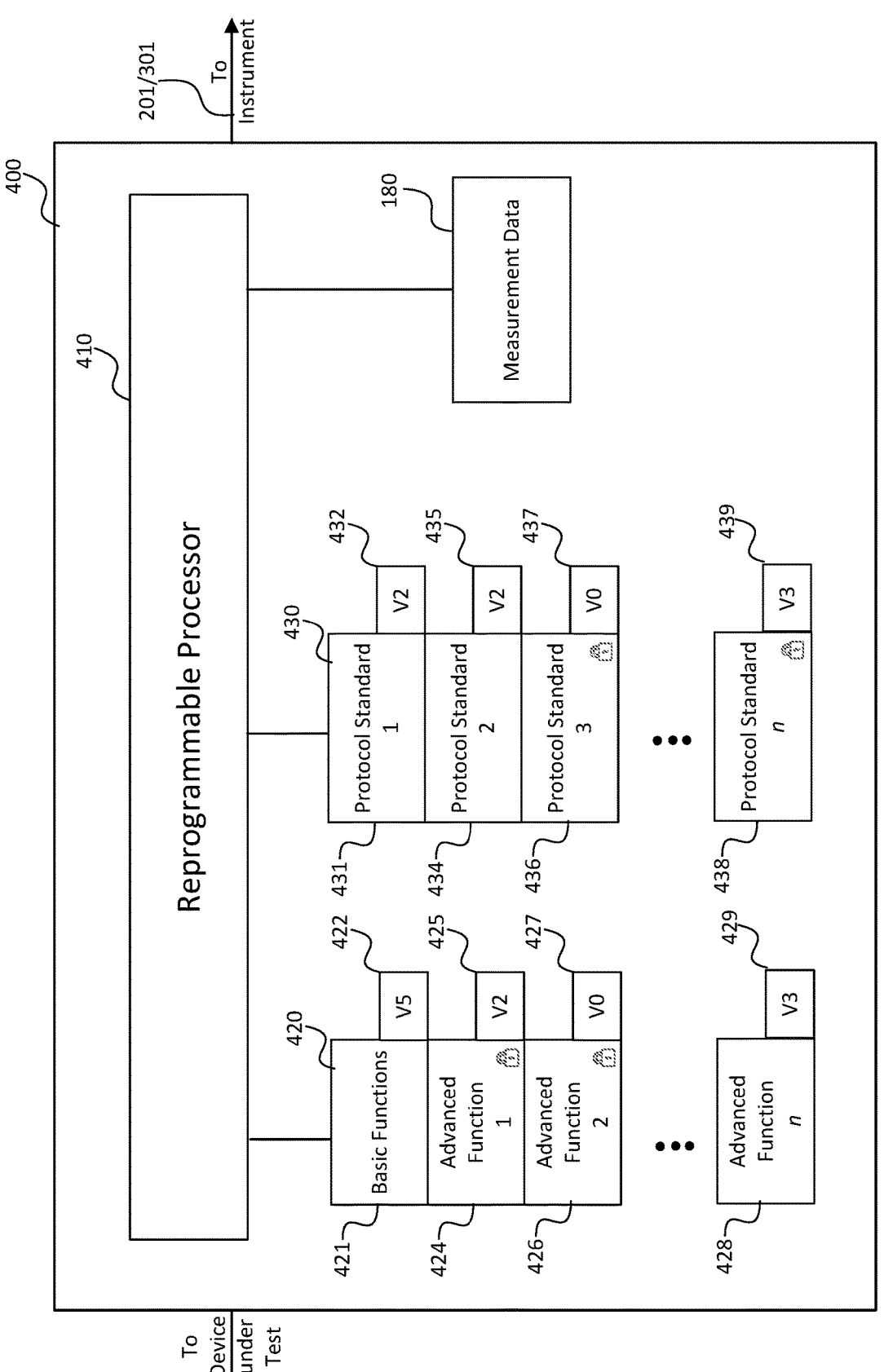
FIG. 3 is an example functional block diagram illustrating updatable functions of the reprogrammable test and measurement accessory according to embodiments of the invention.

FIG. 3 is an example functional block diagram illustrating example functions of a reprogrammable test and measurement accessory 400, which may be an implementation of the accessory 100 of FIGS. 1 and 2. As described above, in some embodiments, the reprogrammable accessory 400 originally contains a set of functions 420. Illustrated functions include basic functions 421, advanced function 1, advanced function 2, and advanced function n, to illustrate that any number of different or separate functions 420 may be a part of and used by the reprogrammable accessory 400. In some embodiments, basic functions 421 are included with a base reprogrammable accessory 400, along with the ability for the user to purchase or install other upgrade functions. Some of the functions are only available if the user pays an additional fee and purchases the function, such as functions 424 and 426, which are illustrated with a lock symbol to indicate a fee must be paid to install those functions. In this illustrated example, basic functions 421 and advance function 428, function n, are free to be used by any user of the reprogrammable accessory 400. In some embodiments, basic functions 421 are always installed, and the other functions may be installed based on user choice. As mentioned above, some of the advanced functions, like advance function 428, may be provided without cost, while some advance functions, like advanced functions 424 and 426 must be acquired separately for an additional fee. To install fee-based advanced functions, the purchaser pays a fee and is given a key or code to 'unlock' only those advanced functions. Or, the purchaser may be provided with a file that, when used to reprogram the accessory 400, adds the functions to or reprograms the entire accessory to include both the basic as well as the advanced functions. Particular examples of advanced functions 424, 426 that may require additional fees include link utilization analysis and flow control functions, for example, although the manufacturer could determine that particular function, is included in either the basic functions or the advanced functions based on the desires of the manufacturer.

Each function 420 includes a version or other identifier to indicate to the user which version is installed. The user can review the most up-to-date versions of the functions to ensure he or she is using the latest version. Some functions 420 may update automatically to the latest version when connecting to a master reprogramming system, while other functions may be updated only based on user request. Functions 420 may be updated individually, or as a group. In some embodiments, purchasing a function, such as advanced function 424, entitles the user to any updates to the function for a period of time. In some embodiments the functions 420 require license or other fees to be paid for periodically to keep the functions active on the reprogrammable accessory 400. With reference to FIG. 3, the set of basic functions 421 is on its fifth version, while the other functions have not been updated as often. VO as the version, such as version 427 of the advanced function 2, 426, indicates that the function is not installed on that particular reprogrammable accessory 400.

In addition to providing advanced functionality, there are many advantages to including a processor 410 or other elements of the reprogrammable accessory 400 that are reprogrammable. One advantage is that the accessory 400 may be updated to address errors (bugs) or any problems that were identified in the accessory 400 after purchase by the user. Conventional devices have no ability to be modified after the user has taken delivery. Another advantage is that different versions of the accessory 400 may be produced each having identical hardware, but each providing different functions based on which functions were originally selected by the user. Such a system that may be personalized for the user may significantly reduce inventory as only 'generic' or basic reprogrammable accessories 400 need be kept in inventory, compared to non-programmable systems that would require inventory of reprogrammable accessories 400 in all possible configurations. When a user purchases an accessory 400, the user could be provided with the accessory 400 in its most basic configuration, as well as the file or code that can reprogram the reprogrammable accessory 400 to match the system that particular user purchased.

Another advantage to having functions 420 individually selectable by the user is that the user may select a reprogrammable accessory 400 that includes a minimal set of functions at a correspondingly low cost. Such a configurable accessory 400 allows the user to purchase only those resources and functions he or she needs, rather than purchasing a more expensive system that includes capabilities or functions not needed by that user.

A further advantage of a reprogrammable accessory, such as the accessory 400 is that the accessory is less likely to go obsolete, since its features and protocols may be updated as technology progresses. Updating features and functions is described above with reference to functions 420. The reprogrammable accessory 400 may also include an ability to analyze or characterize data from the DUT 20 (FIGS. 1 and 2) based on data protocol standards, such as Peripheral Computer Interconnect Express (PCIe), High-Definition Multimedia Interface (HDMI), Serial Peripheral Interface (SPI) and Enhanced Serial Peripheral Interface (eSPI), Universal Serial Bus (USB), and Display Port (DP) standards, for instance. Other protocol standards used by the reprogrammable accessory may include Inter-Integrated Circuit (I2C), MIPI I3C, RS-232/422/485/UART, System Power Management Interface Protocol (SPMI), Controller Area Network (CAN), Controller Area Network Flexible Data-Rate (CAN FD), Local Interconnect Network (LIN), FlexRay, Single Edge Nibble Transmission (SENT), Peripheral Sensor Interface (PSIS), Clock eXtension Peripheral Interface (CXPI), Automotive Ethernet, MIPI C-PHY, MIPI D-PHY, Ethernet 10/100, Audio (I2S/LJ/RJ/TDM), MIL-STD-1553, ARINC 429, Spacewire, 8B/10B encoding, NRZ encoding, Manchester encoding, Serial Voltage Identification Debug (SVID), Synchronous Data Link Control (SDLC), 1-Wire, and Management Data Input/Output (MDIO), as well as future version of these protocols, or additional protocols as they are developed. Embodiments of the invention may include updatable or reprogrammable protocol standards 430. As described above, each protocol standard, such as Protocol Standard 1, 431 and Protocol Standard n, 438 includes its own version, or list of versions, that are present on the reprogrammable accessory 400. Some protocols, such as Protocol Standard 3, 436, may only be unlocked upon purchase. Being able to update the reprogrammable accessory 400 allows the accessory to stay current as protocols evolve, including new protocols or new versions of protocols that hadn't been adopted prior to the release of the reprogrammable accessory 400.

Figure 4:
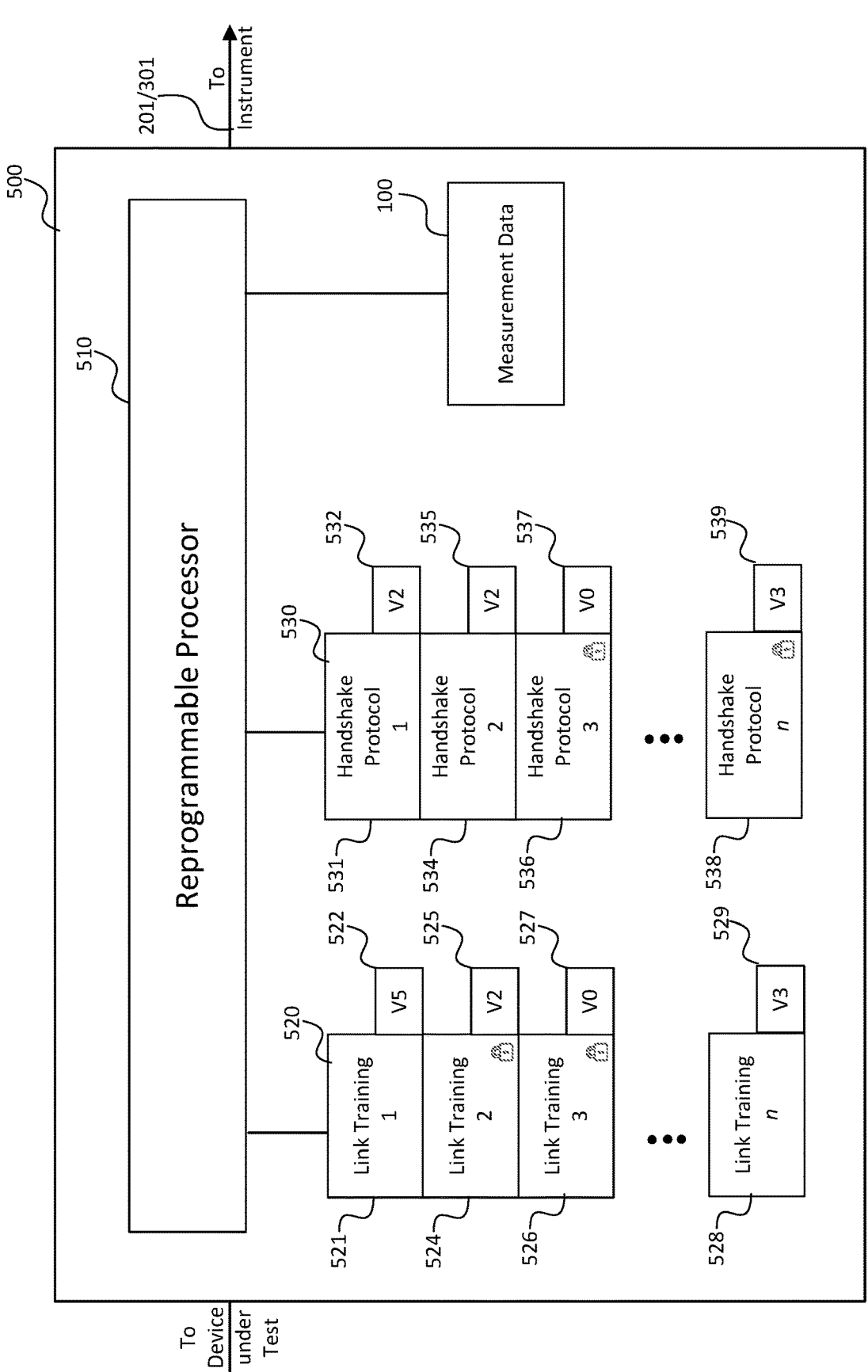
FIG. 4 is an example functional block diagram illustrating updatable link training and handshake protocol functions of the reprogrammable test and measurement accessory according to embodiments of the invention.

FIG. 4 is an example functional block diagram illustrating handshaking and link-training functions of a reprogrammable test and measurement accessory 500, which may be an implementation of the accessory 100 of FIGS. 1 and 2.

The signals of many standards-based communications channels may be acquired from a DUT 20 and analyzed by a measurement device, such as an oscilloscope. To thoroughly test transmitters on such channels, a test system may need to be able to communicate or handshake with a data transmitter in the DUT 20 in real time, to place the transmitter in various modes, such as with link-training or beam-forming protocols.

This handshaking may need to happen faster than could be accomplished with post-processing of the acquired data in the oscilloscope 200 (FIG. 1). Also, the handshaking protocol may not be known or finalized at the time an oscilloscope is designed, so the appropriate hardware may not be present in the oscilloscope 200.

This handshaking may be implemented in a programmable test accessory, such as the reprogrammable accessory 500, which acts as a participant on the communication channel between the DUT 20 and the measurement instrument, such as the oscilloscope 200. In other words, the accessory 500 may receive and analyze data from the DUT 20, and pass both its characterization of the data as well as the data itself from the DUT to the instrument for analysis by the instrument, such as the oscilloscope 200 or tablet 300.

The programmable accessory 500 implements the time-critical handshaking protocols 530. FIG. 4 illustrates that the programmable accessory 500 includes several different protocols 530, each of which may be individually updated and managed. And, as described above for functions, the various handshaking protocols 530 may be updated in the field as new protocol details are implemented into a new or existing standard. Similarly, the programmable accessory 500 implements link training for various systems. Link training, as used herein, refers to an accessory receiving signals from the DUT 20, analyzing such signals, and sending signals and/or data back to the DUT to force the DUT into a desired mode, such as a loopback mode. This may be different from a handshake protocol, which may refer to the programmable accessory 500 receiving data from the DUT 20 and sending back data and/or signals to cause the DUT 20 to establish a communication channel at a certain data rate, but in the same device mode.

In operation, programmable accessory 500 first receives data from the DUT 20 and analyzes the data by comparing it or checking it against defined data standards. Then, the programmable accessory 500 uses its stored link trainings 520 and/or handshake protocols 530 to generate and send signals from its I/O ports 102 to the DUT 20 to place the transmitter in the DUT into the desired test condition(s). After the programmable accessory 500 has completed the DUT setup, then the programmable accessory 500 may pass through the signals from the DUT 20 to the instrument 200, which then acquires and analyzes the communication signals from the DUT. As mentioned above, in addition to sending the data directly from the DUT 20 to the instrument, the programmable accessory 500 may also indicate to the instrument 200 the parameters it negotiated with the DUT, or, in other words, the programmable accessory 500 may also indicate to the instrument which mode the DUT is operating in, or other information about the DUT, after having been placed in that mode by the programmable accessory 500.

Because the final analysis is performed on the signal acquired in the measurement instrument, such as the oscilloscope 200, the programmable accessory 500 need not have as high signal fidelity as the oscilloscope.

A further issue in using an oscilloscope 200 as an instrument to test a communication channel transmitter of a DUT 20 is the limited acquisition length of an oscilloscope. Modern, high-speed oscilloscopes have a limited acquisition length due to their limited memory and extremely fast acquisition speed. The desired bit error rate (BER) for a channel of a DUT 20 being tested is often low enough that there is a very small chance of capturing an error in any one acquisition by the oscilloscope 200. Post-acquisition analysis routines performed by the oscilloscope 200 often extrapolate measurements of channel parameters on an acquisition record containing no errors, trying to predict the likelihood of errors in longer durations than the oscilloscope could capture.

A programmable test accessory, such as the reprogrammable accessory 100 of FIGS. 1 and 2 includes a trigger mode 130 to place the accessory into an error detector or margin watcher mode. In such a mode, the reprogrammable accessory 100 inspects data received from the DUT 20, but does not pass the data to the oscilloscope 200 until the predefined trigger condition is met. In some embodiments the reprogrammable accessory 100 does pass the data from the DUT 20 to the oscilloscope 200 and simultaneously monitors the data to indicate to the oscilloscope 200 when the trigger condition has been met. Then, once the trigger has been satisfied, the reprogrammable accessory 100 informs the oscilloscope 200 that the trigger condition has been met, and passes (or continues to pass) the data from the DUT 20 to the oscilloscope 200. In this mode the accessory 100 acts as the trigger to cause the oscilloscope to begin recording data from the DUT 20.

Triggers stored in the error detector 130 and operable by the reprogrammable accessory 100 include bit errors, voltage violations, timing errors, etc. Including such an error detection mode in the reprogrammable accessory 100 increases the likelihood of the worst-case conditions on the communication channel being acquired and analyzed, thus minimizing the extrapolation errors of current methods. As with other functions, the triggers, margins, and other error detectors 130 may be updated or reprogrammed as desired by the user, or as certain protocols or standards are updated with new or updated triggers, margins, and other error conditions.

For bi-directional or other multi-transmitter channel standards, the reprogrammable accessory 100 could track the active transmitter(s) in the DUT 20 in real time and trigger the oscilloscope 200 to capture the desired transmitter's communication signals.

DUTs often have many signal lanes that need to be measured, but often acquisition hardware only measures a few signals at a time. Also, oftentimes the signal lanes are in a concentrated area, which makes measuring the individual lanes difficult.

Figure 5:
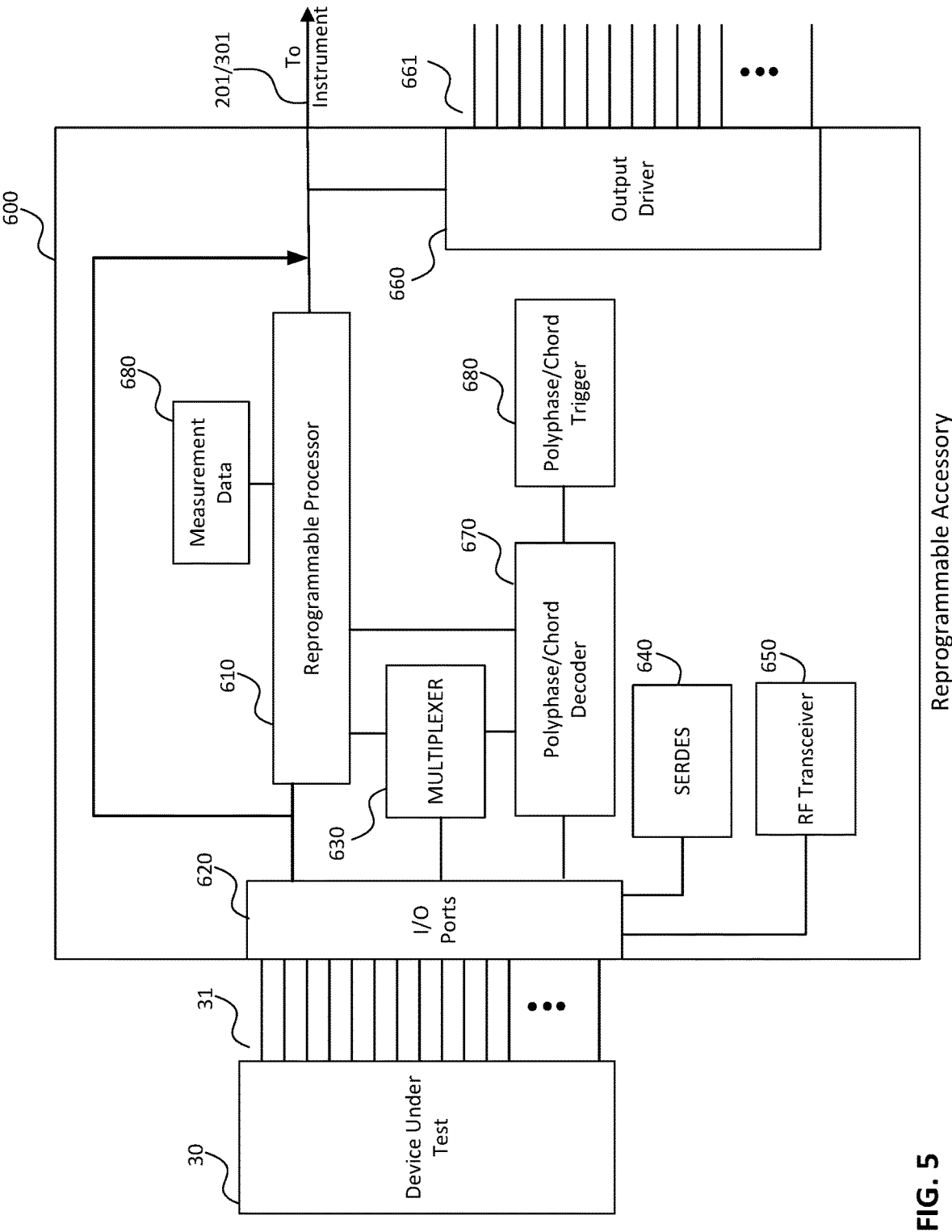
FIG. 5 is an example functional block diagram illustrating a reprogrammable test and measurement accessory structured to manage multiple incoming signals and produce multiple outgoing signals, according to embodiments of the invention.

FIG. 5 is an example functional block diagram illustrating a reprogrammable test and measurement accessory 600 structured to manage multiple incoming signals, according to embodiments of the invention. DUT 30 is an example of a DUT having multiple signal lanes in a communication channel 31. The signal lanes from the communication channel are accepted at I/O ports 620 of the reprogrammable accessory 600. The reprogrammable accessory 600 includes a multiplexer (MUX) 630, coupled to the I/O ports 620 and structured to individually select one or more of the incoming signal lines for further operations.

Especially in instances where the reprogrammable processor 610 is an FPGA, the reprogrammable accessory 600 can be used to route signals, since an FPGA processor has many configurable input and outputs as well as internal processing. FPGAs may include application specific I/O cells on the same chip, or as tiles in a multichip module. Further, a reprogrammable processor implemented by an FPGA may include one or more SERDES blocks 640, RF transceivers 650, and other specific kinds of I/O. In combination, these blocks included in the reprogrammable processor 610 may be configurable in such a way to sample or measure an input signal from the DUT 30 and/or reconstruct it on the output of the FPGA before sending it to an instrument, such as the oscilloscope 200. Furthermore, it is often desirable to probe a DUT and send the output to several different pieces of equipment, such as an oscilloscope, logic analyzer, power analyzer, spectrum analyzer, or vector network analyzer. Reprogrammable accessory 600 further includes an output driver 660 that is structured to take an output signal, such as an output selected by the MUX 630 or another signal that is being sent to the instrument and duplicate the output signal to a set of output signals 661 for sending to any or all of the above-mentioned other types of instruments for evaluating data and signals, such as a logic analyzer, power analyzer, spectrum analyzer, or vector network analyzer.

Newer DUTs, such as the DUT 30 of FIG. 5 may include data that is sent using chord signaling. Chord signaling is related to differential signaling. A standard differential signal delivers one data bit on two correlated wires, while Chord signaling delivers multiple bits on multiple correlated wires, all at the same time. Chord signaling can be thought of as polyphase differential signaling scheme, but is more complicated and poses difficulty in decoding and interpretation for instruments that have traditional channels and triggers. The reprogrammable accessory 600 includes a polyphaser/Chord decoder 670. The decoder 670 receives signals from multiple input ports 620 or the MUX 630 simultaneously and decodes the received signals into data, which may be passed to the processor 610 and further to the oscilloscope 200. In some embodiments the MUX 630 may pass all of the correlated wires carrying a Chorded signal to the decoder 670 in concert. Similar to that described above, the reprogrammable accessory 600 may also deliver to the instrument measurement information and other characterization about the decoded Chorded data, along with the data itself. Further, after decoding the Chorded data, a Chord trigger 680 may determine that a trigger condition has been met, and generate a trigger signal or error condition signal based on the decoded Chord signal, as described above for standard triggers.

A benefit to having the Chord decoder 670 and Chord Trigger 680 in a reconfigurable system is that the decoder and trigger functions may be updated as the standards for Chord data evolve. For instance, a reprogrammable accessory 600 may initially be programmed with a Chord decoder 670 that properly decodes five bits on six correlated wires simultaneously, such as CNRZ-5 coding. Then, if a new Chord decoder were developed that decoded even more bits on more correlated wires simultaneously, the Chord decoder 670 could be updated to the new multi-wire decoder. Further, the MUX 630 could also be updated to send the new group of correlated signal wires to the updated decoder 670.

Similar to Chord decoding as described above, the decoder 670 and trigger 680 may alternatively or additionally be structured to interpret multi-threshold signaling, such as PAM4, coding. One of the benefits of having a reprogrammable accessory 600 is that the accessory 600 may be continuously updated as data transfer methods and protocols evolve.

Often in high performance applications, the acquisition path of the testing system, such as the system 10 of FIG. 1 may be adjusted based on the input signal received by the DUT to optimize it for noise, sample rate, bandwidth, trigger levels, and other parameters. This is either a manual process or done by circuitry or logic contained in the instrument.

Embodiments of the invention such as the reprogrammable accessory 100 include a reprogrammable processor 110 that can analyze data as it is received from the DUT 20. Then, after completing its analysis, the reprogrammable processor 110 and/or a setup control function 150 (FIGS. 1 and 2) sends a signal to the DUT 20 through the I/O ports 102, or sends a signal to the instrument 200 over communication channel 201 to modify or configure either the DUT 20 or instrument 200, respectively. In the embodiment illustrated in FIG. 2, signals from the DUT 20 and analyzed by the programmable accessory 100 may cause the setup control function 150 to send configuration instructions to the tablet 300 over the communication channel 301, in addition to sending signals from the I/O ports 102 to set up or configure the DUT 20.

For example, the accessory 100 may transmit information to the instrument 200 for use in configuring the noise reduction systems described in U.S. Pat. Nos. 10,502,763 and 10,432,434, the contents of which are hereby incorporated by reference.

Some existing probes perform some operations on data from a DUT. These existing probes may include gain control options, or convert data from differential to single-ended signaling. Other probes may perform frequency mixing, and some perform optical-to-electrical conversion. In all of these cases, some information received by the probe is lost that may be desirable to synchronize with the acquisition by the measurement device. According to some embodiments of the disclosure, a reprogrammable accessory 700 includes a synchronization function 790 to send and receive synchronization signals on a line or bus 791 to and from a measurement instrument. This synchronization signal is further tied to the trigger and to the control systems of the oscilloscope, such as the reprogrammable triggers 130 and reprogrammable setup/control function 150 of FIGS. 1 and 2. This functionality of having a synchronization signal allows the instrument, such as an oscilloscope to change settings and generate additional information based on activity sensed in the reprogrammable accessory 700. For example, assume the reprogrammable accessory 700 includes the reprogrammable triggers 130 and reprogrammable setup/control function 150 of FIGS. 1 and 2. Then, in operation, the reprogrammable accessory 700 can monitor signals and data from the DUT 30 to scan for trigger conditions. For example, the reprogrammable accessory 700 can monitor a pair of differential signals received at the I/O ports 720 from the DUT 30 for a large, common mode pulse. Then, if such a pulse occurs that exceeds the programmed threshold, the trigger 130 can send a trigger signal to the instrument, as described above. The trigger signal may be sent as a signal on the synchronization line 791 to inform the instrument that the common mode pulse exceeded its programmed threshold at a particular time. This trigger signal may be sent in parallel to the decoded differential signal. Similar synchronization or trigger signals could be generated if, for instance, the error detector 130 detected that an RF mixing front end 650 of a reprogrammable accessory detected an over-range. Error detector 130 is meant to include all forms of detecting errors, and is not limited to any specific types of errors. In such a case, the synchronization control 790 could inform the instrument, by placing a signal on the synchronization line 791, that the over-range occurred. In addition to notifying the instrument that such an over-range occurred, the reprogrammable accessory 700 could invoke its setup/control function 150, triggered by the over-range, to automatically adjust the gain in the RF mixer 650 in the reprogrammable accessory.

Similarly, there are applications for synchronization from the instrument to one or more accessories, whether the accessories be programmable or not. For instance, a single instrument may be coupled to multiple programmable accessories, and the latency between each accessory and the instrument may be different for each accessory. Embodiments of the invention use a synchronizing signal on the synchronization line 791 to measure the latency between each of the accessories coupled to the instrument. In operation, the instrument sends real-time edge to each of the accessories coupled to the instrument on the synchronization line 791. The accessory, such as the reprogrammable accessory 700, receives the real-time edge signal and sends a return signal back to the instrument. The instrument measures the delay between sending and receiving the synchronization signal on each of its channels, i.e., for each of the connected accessories. Then, based on the delay, or relative delay, the instrument may configure itself to accommodate or eliminate the relative delay, such as by shifting or delaying the signals received from some of the accessories so that they all arrive at the same time relative to one another. In one embodiment the instrument expects a certain delay from an accessory and merely inspects the synchronization signal to ensure the delay matches the expectation. In such a system, only if the delay is outside of the expected delay would the instrument make changes.

In other embodiments the reprogrammable accessory 700 may use the synchronization control in conjunction with the DUT 30. For example the reprogrammable accessory 700 may generate a synchronization signal and send it to the DUT 30 through the I/O ports 720. Then the reprogrammable accessory 700 monitors the signals received from the DUT 30 to determine when or whether the DUT 30 made a response in response to receiving the synchronization signal. In this way the reprogrammable accessory 700 may be used to recognize and measure Time Domain Reflection or Time Domain Transmission (TDR/TDT). Further, when multiple reprogrammable accessories 700 are coupled to a same DUT 30, a synchronization signal sent from one reprogrammable accessory 700 may be sensed by another reprogrammable accessory 700. Or, a synchronization signal sent from one reprogrammable accessory 700 may provoke a response in the DUT 30 that is being monitored by one or more other reprogrammable accessories, any or all of which send information to a single instrument. Then, the instrument may analyze the data from the reprogrammable accessories 700 to determine if the synchronization pulse or other stimulus from one of the reprogrammable accessories 700 caused the DUT 30 to respond in a particular way. This process may be used in a test and measurement system to characterize a data bus, for instance.

Figure 6:
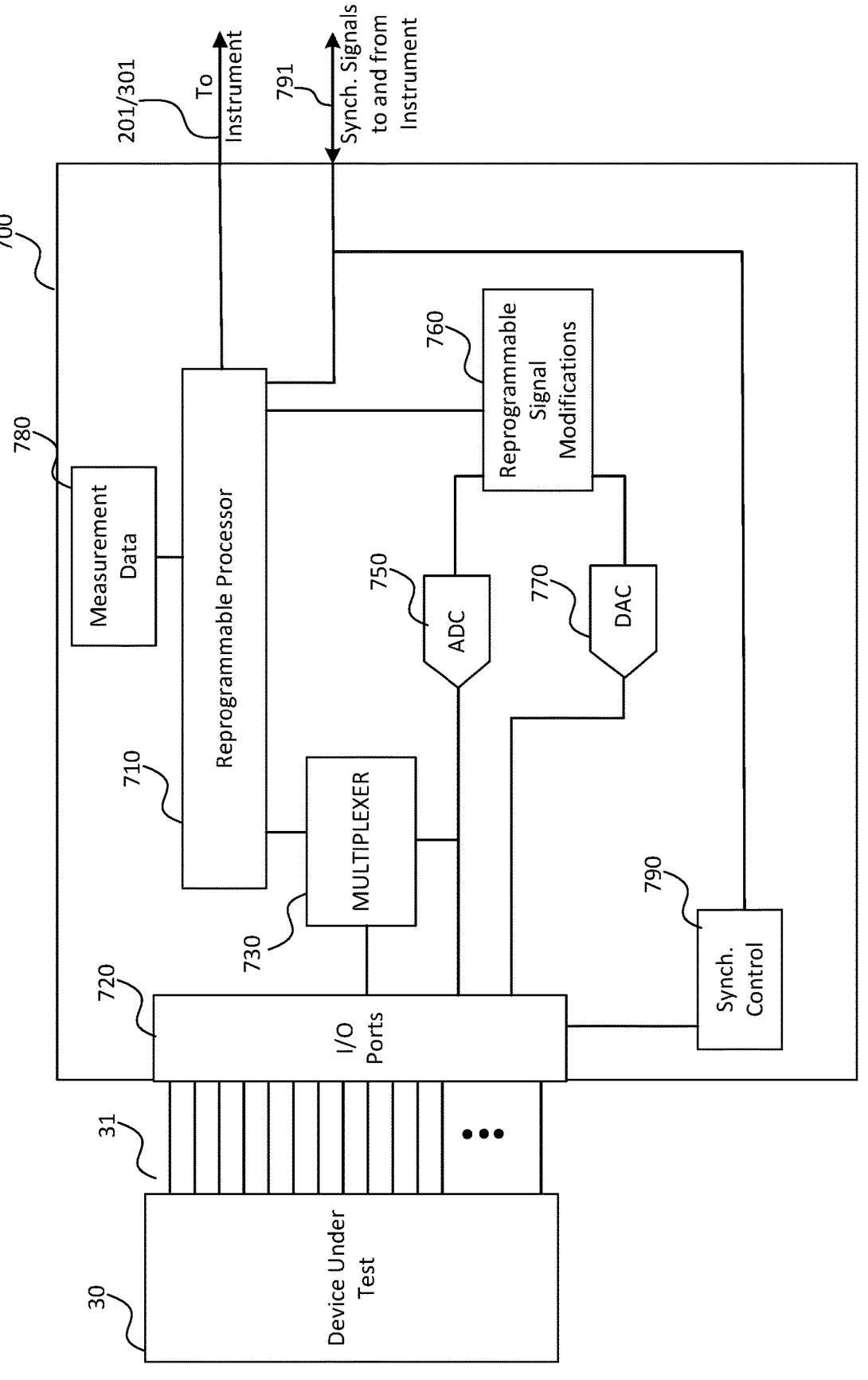
FIG. 6 is an example functional block diagram illustrating a reprogrammable test and measurement accessory including enhanced features according to embodiments of the invention.

Sending a signal from the reprogrammable accessory 700 to provoke a response in the DUT 30 may extend beyond merely the synchronization function described above. As illustrated in FIG. 6, the reprogrammable accessory 700 includes an Analog to Digital Converter (ADC) 750 as well as a Digital to Analog Converter (DAC) 770. Such a configuration allows the reprogrammable accessory 700 to provide closed loop control and acquisition from the DUT 30 simultaneously. In other words, the reprogrammable accessory 700, through use of the ADC 750 and DAC 770 may receive a signal from the DUT 30, modify the signal in a modifier 760, then send the modified signal back to the DUT 30 and then monitor the DUT 30 output for a response.

The modifications 760 to be applied to the signal received from the DUT may be user-configurable, or a base set of modifications may be included in the reprogrammable accessory 700. An example application of these embodiments is a software defined radio (SDR) in a reprogrammable accessory. In such an embodiment, a signal is received from the DUT 30, and may modified by the reprogrammable accessory 700. For instance, the reprogrammable accessory 700 may extract the signal from the carrier that was at a first frequency, then modify the carrier in the modifier 760. Then, after the new carrier was mixed into the signal, the newly mixed signal could be sent back to the DUT 30, the instrument, or elsewhere depending on user preference. In some embodiments the new signal could be distributed in its digital form, out of the modifier 760, instead of or as well as in an analog form, after being converted in the DAC 770.

A specialized ADC 750 could be included in the reprogrammable accessory 700 that are more typically used for specific applications like spectrum analysis or high accuracy Digital MultiMeter (DMM) functionality. Including such an ADC 750 in the reprogrammable accessory 700 allows the reprogrammable accessory 700 to include these advanced functions in its operation. In some embodiments with a DMM specialized ADC 750, and in which the reprogrammable accessory 700 is coupled to a tablet 300, such as described with reference to FIG. 2, such a system would provide DMM functionality on the tablet 300 itself.

Further, the reprogrammable accessory 700 could be configured to operate as a source measure unit (SMU). The reprogrammable accessory 700 can provide a power signal to the DUT 30 through the I/O ports 720. Also in such an embodiment, the reprogrammable accessory 700 could add interference, such as noise or ripple in the modifier 760 to the power signal or to another signal received from the DUT 30, and send it back to the DUT. Then, the same reprogrammable accessory 700 can monitor the effects of the added interference in a closed loop system.

In yet other embodiments, the reprogrammable accessory 700 could be used to alter any signal received from any source. As described above, the reprogrammable accessory 700 can monitor wireless channels, such as an RF channel through the RF Transceiver 650 of FIG. 5. In some embodiments, the reprogrammable accessory 700 can monitor an RF channel, such as a frequency used for Radio Detection and Ranging (RADAR) or other purposes. Then, after decoding the signal by the ADC 750, the modifier 760 may be used to modify the received signal, such as by removing or changing information carried on the channel, or modifying the channel characteristics itself. Then the DAC 770 converts the modified signal back to analog, and the modified signal may be rebroadcast from the RF transceiver 650 to the I/O Ports 720. The modified signal may be broadcast at a higher power or have other properties than the RF signal that was originally received.

Although the figures described herein described certain embodiments, it is possible that a single reprogrammable processor include any or all of the features described above. In other words, merely because various functions were not depicted in the same drawings does not mean that they cannot be implemented in the same device. Further, certain devices may implement some of the above-described functions while not implementing others. Nothing written above should be construed to the contrary.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the technologies disclosed herein are provided below. A configuration of the technologies may include any one or more, and any combination of, the examples described below.

Example 1 is a test system, comprising a programmed device having an input port for receiving a signal for testing or measuring on the programmed device, and a reprogrammable test accessory having an output coupled to the input port of the programmed device. The reprogrammable test accessory includes a test port structured to accept one or more test signals from a Device Under Test (DUT), and a reprogrammable processor operable in a first configuration and a second configuration, the reprogrammable processor configured to process the one or more test signals received from the DUT.

Example 2 is a test system according to Example 1, in which the reprogrammable test accessory further comprises a data analyzer for evaluating data received from the one or more test signals from the DUT, and in which the data analyzer is structured to analyze the received data using a first version of a data standard in the first configuration, and structured to analyze the received data using a second version of the data standard in the second configuration.

Example 3 is a test system according to Example 2, in which the data standard is a standard selected from the group consisting of Universal Serial Bus (USB), Peripheral Computer Interconnect Express (PCIe), High-Definition Multimedia Interface (HDMI), Serial Peripheral Interface (SPI), Enhanced Serial Peripheral Interface (eSPI), and Display Port (DP).

Example 4 is a test system according to any of the preceding Examples, in which the reprogrammable test accessory further comprises an error trigger analyzer for evaluating information and data received from the one or more test signals from the DUT and generating an error signal based on a comparison of the received information or data to a trigger condition, and in which the error trigger analyzer is structured to use a first error trigger condition in the first configuration, and structured to use a second error trigger condition in the second configuration.

Example 5 is a test system according to Example 4, in which the first error trigger condition is an error trigger selected from the group consisting of bit error, code error, jitter error, and threshold error.

Example 6 is a test system according to any of the preceding Examples, in which the reprogrammable test accessory further comprises a link training function for placing the DUT into a particular pre-set operating mode, and in which the link training function is structured to use a first link training protocol in the first configuration, and structured to use a second link training protocol in the second configuration.

Example 7 is a test system according to Example 6, in which the first link training protocol is a protocol selected from the group consisting of Universal Serial Bus (USB), Peripheral Computer Interconnect Express (PCIe), High-Definition Multimedia Interface (HDMI), Ethernet, and one of the MIPI PHY protocols.

Example 8 is a test system according to any of the preceding Examples in which the reprogrammable test accessory further comprises a DUT setup mode operable to evaluate data received from the one or more test signals from the DUT, and change an operating mode of the DUT based on the evaluated data.

Example 9 is a test system according to Example 8, in which the DUT setup mode includes at least one mode in the first configuration and at least two modes in the second configuration.

Example 10 is a test system according to any of the preceding Examples, in which the reprogrammable test accessory is structured to pass the one or more test signals from the DUT to the input port of the programmed device without substantial modification.

Example 11 is a test system according to any of the preceding Examples, in which the reprogrammable test accessory is structured to send to the input port of the programmed device signals that are substantially different than the one or more test signals received from the DUT.

Example 12 is a test system according to Example 11, in which the reprogrammable test accessory is structured to send to the input port of the programmed device signals that are different than the one or more test signals received from the DUT, and is also structured to pass the one or more test signals from the DUT to the input port of the programmed device without substantial modification.

Example 13 is a test system according to any of the preceding Examples, in which the programmed device is a tablet computer or mobile phone.

Example 14 is a test system according to any of the preceding Examples, in which the programmed device is structured to identify a data protocol of data received from the reprogrammable test accessory.

Example 15 is a test system according to Example 14, in which the data received from the reprogrammable test accessory was generated by the DUT.

Example 16 is a test system according to Example 14, in which the data received from the reprogrammable test accessory was generated by the reprogrammable test accessory.

Example 17 is a test system according to any of the preceding Examples, in which the reprogrammable test accessory comprises memory for storing data received from the DUT.

Example 18 is a test system according to any of the preceding Examples, in which the programmed device is structured to receive data from the reprogrammable test accessory, store the received data, and send the stored data to an output of the programmed device.

Example 19 is a test system according to any of the preceding Examples, in which the reprogrammable test accessory further comprises a reprogramming facility for modifying the reprogrammable processor from the first configuration to the second configuration.

Example 20 is a test system according to any of the preceding Examples, in which the reprogrammable processor is an FPGA, a microcontroller, or a System-on-Chip (SoC).

Example 21 is a test system according to any of the preceding Examples, in which the programmed device is a test and measurement instrument.

Example 22 is a test system according to Example 21, in which the test and measurement instrument is one selected from the group consisting of oscilloscope, logic analyzer, power analyzer, spectrum analyzer, and vector network analyzer.

Example 23 is a test system, comprising a test and measurement device having an input port for receiving a signal for testing or measuring; and a reprogrammable test accessory having an output coupled to the input port of the test and measurement device. The reprogrammable test accessory includes a test port structured to accept one or more test signals from a Device Under Test (DUT), a processor, and a reprogrammable link trainer for placing the DUT into a particular pre-set operating mode, the reprogrammable link trainer able to be modified from a first configuration to a second configuration.

Example 24 is a test system according to Example 23 in which an error is reported if the DUT does not enter the pre-set operating mode when directed by the reprogrammable link trainer.

Example 25 is a test system, comprising a test and measurement device having an input port for receiving a signal for testing or measuring, a reprogrammable test accessory having an output coupled to the input port of the test and measurement device. The reprogrammable test accessory includes a test port structured to accept one or more test signals from a Device Under Test (DUT), a processor, and a reprogrammable data protocol analyzer for determining whether data carried by the one or more test signals from the DUT conforms to a particular pre-set data protocol, the reprogrammable data protocol analyzer able to be modified from a first configuration to a second configuration.

Example 26 is a test system, comprising a test and measurement device having an input port for receiving a signal for testing or measuring, and a reprogrammable test accessory having an output coupled to the input port of the test and measurement device. The reprogrammable test accessory includes a test port structured to accept one or more test signals from a Device Under Test (DUT), a processor, and a reprogrammable trigger detector for comparing the one or more test signals from the DUT to one or more pre-determined triggers and generating a trigger signal based on the comparison, the reprogrammable trigger detector able to be modified from a first configuration to a second configuration.

Example 27 is a test system, comprising a test and measurement device having an input port for receiving a signal for testing or measuring, and a reprogrammable test accessory having an output coupled to the input port of the test and measurement device. The reprogrammable test accessory includes a test port structured to accept one or more test signals from a Device Under Test (DUT), a processor, and a reprogrammable margin detector for determining a margin error has occurred in data received from the one or more test signals, and generating a trigger signal based on the comparison, the reprogrammable margin detector able to be modified from a first configuration to a second configuration.

Example 28 is a test system according to Example 27, in which the margin detector tests a receiver on the DUT by generating an impaired signal.

Example 29 is a test system according to Example 28, in which the margin detector impairs the generated signal until the DUT reports an error.

Example 30 is a test system according to Example 27, in which the margin detector tests a transmitter on the DUT by measuring a signal received from the DUT.

Example 31 is a test system, comprising a test and measurement device having an input port for receiving a signal for testing or measuring, and a reprogrammable test accessory having an output coupled to the input port of the test and measurement device. The reprogrammable test accessory includes a test port structured to accept one or more test signals from a Device Under Test (DUT), a processor, and a reprogrammable error detector for comparing the one or more test signals from the DUT to one or more pre-determined error conditions and generating a trigger signal based on the comparison, the reprogrammable error detector able to be modified from a first configuration to a second configuration.

Example 32 is test system, comprising a test and measurement device having an input port for receiving a signal for testing or measuring, and a reprogrammable test accessory having an output coupled to the input port of the test and measurement device. The reprogrammable test accessory includes a test port having multiple input ports structured to accept test signals from a Device Under Test (DUT) on at least two separate input ports, a processor, and a reprogrammable multiplexer coupled to the multiple input ports and structured to pass to an output of the multiplexer a test signal received on one of the at least two separate input ports, the reprogrammable multiplexer able to be modified from a first configuration to a second configuration.

Example 33 is a test system, comprising a test and measurement device having an input port for receiving a signal for testing or measuring; and a reprogrammable test accessory having an output coupled to the input port of the test and measurement device. The reprogrammable test accessory includes a test port having multiple input ports structured to accept test signals from a Device Under Test (DUT) on at least three separate input ports, a processor, and a reprogrammable Chord decoder coupled to the multiple input ports and structured to decode Chord data sent from the DUT on the at least three separate input ports, the reprogrammable Chord decoder able to be modified from a first configuration to a second configuration.

Example 34 is a test system, comprising a test and measurement device having an input port for receiving a signal for testing or measuring, and having a synchronization channel separate from the input port, and a test accessory having an output coupled to the input port of the test and measurement device. The test accessory includes a synchronization transceiver coupled to the synchronization channel, a test port structured to accept one or more test signals from a Device Under Test (DUT), a processor, and a trigger generator coupled to the synchronization transceiver. The trigger generator is structured to generate a trigger signal based on a comparison of the one or more test signals from the DUT to one or more pre-determined trigger conditions.

Example 35 is the test system of Example 34, in which the test accessory is reprogrammable.

Example 36 is the test system of Example 35 in which the trigger generator is reprogrammable.

Example 31 is a test system according to Example 30, in which the reprogrammable test accessory is structured to receive a synchronization input signal from the test and measurement device on the synchronization channel.

Example 37 is a test system, comprising a test and measurement device having an input port for receiving a signal for testing or measuring, and a reprogrammable test accessory having an output coupled to the input port of the test and measurement device. The reprogrammable test accessory includes a test port structured to accept one or more test signals from a Device Under Test (DUT), an output port, a processor, an Analog to Digital Converter (ADC) and a Digital to Analog Converter (DAC).

Example 38 is a test system according to Example 37, further comprising a reprogrammable digital signal modifier for modifying the one or more test signals received from the DUT after it has been converted to a digital signal by the ADC.

Example 39 is a test system according to Example 38, further comprising sending the modified signal to the DUT.

Although specific aspects of the disclosure have been illustrated and described for purposes of illustration, it will be understood that various modifications may be made without departing from the spirit and scope of the disclosure. Accordingly, the disclosure should not be limited except as by the appended claims.

We claim:

1. A test system, comprising:
a test and measurement device having an input port for receiving signals for testing or measuring; and
a reprogrammable test accessory having an output coupled to the input port of the test and measurement device, the reprogrammable test accessory including:
a test port structured to accept one or more test signals from a Device Under Test (DUT),
a processor,
a reprogrammable data protocol analyzer for determining whether data carried by the one or more test signals from the DUT conform to a predetermined data protocol, and
a reprogramming facility for modifying the reprogrammable data protocol analyzer from a first configuration to a second configuration, in which the reprogramming facility of the reprogrammable test accessory is operable only for authorized users of the test and measurement device, and in which a user is determined to be an authorized user of the test and measurement device based on determining whether the user has purchased an authorization key for the second configuration.

2. The test system of claim 1, in which the second configuration allows the reprogrammable data protocol analyzer to receive data according to a data standard different than that of the first configuration.

3. The test system of claim 1, in which the second configuration allows the reprogrammable data protocol analyzer to receive data according to an updated data standard to the data standard of the first configuration.

4. The test system of claim 1, in which the predetermined data protocol is a protocol selected from the group consisting of Universal Serial Bus (USB), Peripheral Computer Interconnect Express (PCIe), High-Definition Multimedia Interface (HDMI), Serial Peripheral Interface (SPI), Enhanced Serial Peripheral Interface (eSPI), and Display Port (DP).

5. The test system of claim 1, in which the reprogramming facility of the reprogrammable test accessory is structured to be coupled to a reprogrammer through a communication channel other than the test port.

6. The test system of claim 1, in which the reprogrammable test accessory further comprises a DUT setup mode operable to:
evaluate data received from the one or more test signals from the DUT; and
change an operating mode of the DUT based on the evaluated data.

7. The test system of claim 1, in which the reprogrammable test accessory is structured to pass the one or more test signals from the DUT to the input port of the test and measurement device without substantial modification.

8. The test system of claim 1, in which the reprogrammable test accessory is structured to send to the input port of the test and measurement device signals that are substantially different than the one or more test signals received from the DUT.

9. The test system of claim 8, in which the reprogrammable test accessory is structured to send to the input port of the test and measurement device signals that are different than the one or more test signals received from the DUT, and is also structured to pass the one or more test signals from the DUT to the input port of the test and measurement device without substantial modification.

10. The test system of claim 1, in which the test and measurement device is a tablet computer or mobile phone structured to operate a test and measurement application.

11. The test system of claim 1, in which the test and measurement device is a test and measurement instrument.

12. The test system of claim 11, in which the test and measurement instrument is one selected from the group consisting of oscilloscope, logic analyzer, power analyzer, spectrum analyzer, and vector network analyzer.

13. The test system of claim 1, in which the reprogrammable test accessory comprises memory for storing data received from the DUT.

14. The test system of claim 1, in which the reprogrammable processor is an FPGA, a microcontroller, or a System-on-Chip (SoC).

15. A method in a reprogrammable test accessory having a test input and having an output for coupling to a test and measurement instrument, the method comprising:
receiving, at the test input, one or more test signals from a Device Under Test (DUT);
determining whether data carried by the one or more test signals from the DUT conform to a predetermined data protocol; and
reprogramming the reprogrammable test accessory from a first configuration to a second configuration based on the determination, in which the reprogramming of the reprogrammable test accessory is operable only for authorized users of the test and measurement instrument, and in which a user is determined to be an authorized user of the test and measurement instrument based on determining whether the user has purchased an authorization key for the second configuration.

16. The method according to claim 15, further comprising storing a new predetermined data protocol on the reprogrammable test accessory.

17. The method according to claim 15, further comprising storing an updated version of the predetermined data protocol already stored on the reprogrammable test accessory.

18. The method according to claim 15, further comprising:
evaluating data received from the one or more test signals from the DUT; and
changing an operating mode of the DUT based on the evaluation.

* * * * *